(12) United States Patent  (10) Patent No.: US 8,735,815 B2
Buchhold et al.  (45) Date of Patent: May 27, 2014

(54) METHOD AND APPARATUS FOR ELECTRON PATTERN IMAGING

(71) Applicant: EDAX, Inc., Mahwah, NJ (US)

(72) Inventors: Reinhard Buchhold, Wayne, NJ (US); Brent Hammell, Newton, NJ (US); Joseph A. Nicolosi, Alford, MA (US); Peter Antonie de Kloe, Dongen (NL)

(73) Assignee: EDAX, Inc., Mahwah, NJ (US)

( * ) Notice: Subject to any disclaimer, the term of this patent is extended or adjusted under 35 U.S.C. 154(b) by 0 days.

(21) Appl. No.: 13/924,786

(22) Filed: Jun. 24, 2013

(65) Prior Publication Data

US 2013/0341506 A1  Dec. 26, 2013

Related U.S. Application Data

(60) Provisional application No. 61/663,102, filed on Jun. 22, 2012.

(51) Int. Cl.
G01N 23/00 (2006.01)
G21K 7/00 (2006.01)

(52) U.S. Cl.
USPC ........ 250/307; 250/306; 250/309; 250/491.1; 250/492.1; 250/492.2; 250/492.21; 250/492.22; 250/492.3

(58) Field of Classification Search
USPC ........ 250/306, 307, 309, 491.1, 492.1, 492.2, 250/492.21, 492.22, 492.3; 850/1, 5, 63
See application file for complete search history.

(56) References Cited

U.S. PATENT DOCUMENTS

| 4,031,390 | A | 6/1977 | Muller et al. |
|---|---|---|---|
| 4,096,386 | A | 6/1978 | Rempfer et al. |
| 4,211,924 | A | 7/1980 | Muller et al. |
| 4,880,977 | A | 11/1989 | Tomita et al. |
| 4,998,788 | A | 3/1991 | Osakabe et al. |
| 5,159,195 | A | 10/1992 | Van House |
| 5,635,720 | A | 6/1997 | Mooney et al. |
| 6,194,719 | B1 | 2/2001 | Mooney et al. |
| 7,394,066 | B2 | 7/2008 | Murakoshi et al. |
| 7,442,931 | B2 | 10/2008 | Zewail et al. |
| 7,915,583 | B2 | 3/2011 | Zewail et al. |
| 2006/0231752 | A1 | 10/2006 | Houge et al. |
| 2006/0291619 | A1 | 12/2006 | Statham |

(Continued)

FOREIGN PATENT DOCUMENTS

| JP | 2006112921 A | 4/2006 |
|---|---|---|
| KR | 20100033450 A | 3/2010 |

(Continued)

*Primary Examiner* — Jack Berman
*Assistant Examiner* — Meenakshi Sahu
(74) *Attorney, Agent, or Firm* — The Webb Law Firm

(57) ABSTRACT

A system for electron pattern imaging includes: a device for converting electron patterns into visible light provided to receive an electron backscatter diffraction (EBSD) pattern from a sample and convert the EBSD pattern to a corresponding light pattern; a first optical system positioned downstream from the device for converting electron patterns into visible light for focusing the light pattern produced by the device for converting electron patterns into visible light; a camera positioned downstream from the first optical system for obtaining an image of the light pattern; an image intensifier positioned between the device for converting electron patterns into visible light and the camera for amplifying the light pattern produced by the device for converting electron patterns into visible light; and a device positioned within the system for protecting the image intensifier from harmful light.

20 Claims, 5 Drawing Sheets

(56) References Cited

U.S. PATENT DOCUMENTS

| | | |
|---|---|---|
| 2008/0265161 A1 | 10/2008 | Murakoshi et al. |
| 2009/0261252 A1 | 10/2009 | Hasegawa et al. |
| 2010/0181480 A1 | 7/2010 | Shimakura et al. |
| 2010/0237242 A1* | 9/2010 | Schwarzer .................... 250/309 |
| 2010/0327161 A1 | 12/2010 | Mooney |
| 2012/0145899 A1 | 6/2012 | Matsumoto |

FOREIGN PATENT DOCUMENTS

| | | |
|---|---|---|
| WO | 9713270 A1 | 4/1997 |
| WO | 9857350 A1 | 12/1998 |
| WO | 0124218 A1 | 4/2001 |

\* cited by examiner

METHOD AND APPARATUS FOR ELECTRON PATTERN IMAGING

CROSS REFERENCE TO RELATED APPLICATIONS

This application claims the benefit of U.S. Provisional Patent Application No. 61/663,102 entitled "Method and Apparatus for Electron Pattern Imaging" filed Jun. 22, 2012, which is hereby incorporated by reference in its entirety.

BACKGROUND OF THE INVENTION

1. Field of the Invention

The present invention is generally directed to a method and apparatus for electron pattern imaging and, more specifically, to the use of an image intensifier to amplify light in an electron backscatter diffraction (EBSD) pattern collection system in a scanning electron microscope (SEM) environment.

2. Description of Related Art

In the field of material microanalysis, EBSD is used to study the microcrystalline characteristics of materials. The method uses the electron beam of an SEM incident on a sample and an electron imaging system to collect the electron diffraction pattern.

With reference to FIG. 1, an example of a current arrangement for conducting EBSD is illustrated. The current arrangement includes a phosphor screen 1, lens (not shown), and a camera 3. The EBSD pattern is produced by illuminating electron beams 5 onto a sample 7 using the SEM 9. The EBSD pattern which falls on the phosphor screen 1 is converted to a corresponding light pattern which is focused by the lens system onto the camera 3. An EBSD map of the sample is produced by rastering the incident beam through an array of points on the sample 7 and collecting corresponding EBSD patterns at each point. EBSD sensitivity and collection speed is determined by at least one of the following: (a) incident electron beam accelerating voltage and current; (b) diffraction characteristics of the sample; (c) phosphor efficiency; (d) lens transmission; and (e) sensitivity and signal-to-noise ratio of the camera.

However, this current arrangement suffers from various deficiencies as discussed hereinafter. For example, SEMs typically operate at up to 30 keV accelerating voltages. However, it is more desirable to operate at much lower voltages and beam currents to minimize the interaction volume within the sample, thereby optimizing spatial resolution and minimizing damage and contamination of the specimen due to the high energy electron interaction. Under low voltage and low current conditions, most SEMs do not provide sufficient beam current for optimal illumination of the phosphor screen. Often accelerating voltage on the sample needs to be increased at the expense of spatial resolution and specimen degradation in order to obtain acceptable EBSD patterns.

Diffraction characteristics of the sample also create limitations in the current arrangement. The intensity of the EBSD pattern produced by the sample depends upon several factors: composition, degree of crystallinity, homogeneity, surface preparation, etc. These conditions diffuse and/or weaken the diffraction pattern incident on the phosphor screen.

The efficiency of the phosphor also plays an important role in the production of the EBSD pattern. Electrons interact with the phosphor material to produce light. The interaction volume is a function of the electron energy, phosphor composition, and thickness. The ideal phosphor needs to be very thin to minimize electron interaction volume, but sufficiently absorbing to convert all of the pattern electrons to light. An additional criteria is that the wavelength of light produced by the phosphor match the sensitive range of the camera.

In addition, lens clarity and F-number determine the amount of light transmitted from the phosphor to the camera. Geometric constraints limit the maximum size of lenses that can be used.

Finally, the sensitivity and signal-to-noise ratio of the camera also play a role in determining the quality of EBSD pattern obtained by the current system. Within the given constraints of sample characteristics and current technology (SEM current, phosphor, and lens efficiency) exposure time to achieve an acceptable EBSD pattern is fundamentally limited by sensitivity and S:N of the camera. This determines the minimum limit of pattern detection and maximum pattern collection speed.

Accordingly, a need exists for a method and apparatus for EBSD pattern collection that amplifies light passing from the phosphor screen to the camera without degrading the signal-to-noise ratio.

SUMMARY OF THE INVENTION

An object of the present invention is to amplify light in an EBSD pattern collection system using an image intensifier in conjunction with a device for safely operating the image intensifier in an electron microscope environment.

Accordingly, provided is a system for electron pattern imaging that includes: a device for converting electron patterns into visible light provided to receive an electron backscatter diffraction (EBSD) pattern from a sample and convert the EBSD pattern to a corresponding light pattern; a first optical system positioned downstream from the device for converting electron patterns into visible light for focusing the light pattern produced by the device for converting electron patterns into visible light; a camera positioned downstream from the first optical system for obtaining an image of the light pattern; an image intensifier positioned between the device for converting electron patterns into visible light and the camera for amplifying the light pattern produced by the device for converting electron patterns into visible light; and a device positioned within the system for protecting the image intensifier from harmful light. The device is selected from the group consisting of: a near infrared (NIR) cut-off filter positioned upstream from the image intensifier for preventing NIR light from reaching the image intensifier, a light sensitive sensor in communication with a controller for detecting when a predetermined level of harmful light has been reached, and a short wavelength photo-cathode material positioned within the system to prevent excitation by NIR light.

The image intensifier may be positioned at any one of the following locations: (1) between the device for converting electron patterns into visible light and the first optical system (2) within the first optical system; or (3) between the first optical system and the camera. If the image intensifier is positioned between the first optical system and the camera, then a second optical system may be positioned between the image intensifier and the camera. The second optical system may include a focusing lens, a relay lens, a fiber optic relay, or any combination thereof. The system may further include an alignment mechanism for aligning at least one of the camera and the image intensifier with the device for converting electron patterns into visible light.

Also provided is a method of electron pattern imaging. The method includes: positioning a device for converting electron patterns into visible light adjacent to a sample; positioning a first optical system downstream from the device for converting electron patterns into visible light; positioning a camera downstream from the first optical system; positioning an image intensifier between the device for converting electron patterns into visible light and the camera; positioning a device within the system for protecting the image intensifier from harmful light; receiving an electron backscatter diffraction (EBSD) pattern from a sample with the device for converting electron patterns into visible light such that the device for converting electron patterns into visible light converts the EBSD pattern to a corresponding light pattern; focusing the light pattern produced by the device for converting electron patterns into visible light with the first optical system; amplifying the light pattern produced by the device for converting electron patterns into visible light with the image intensifier; and obtaining an image of the light pattern with the camera. The device for protecting the image intensifier from harmful light is selected from the group consisting of: a near infrared (NIR) cut-off filter positioned upstream from the image intensifier for preventing NIR light from reaching the image intensifier, a light sensitive sensor in communication with a controller for detecting when a predetermined level of harmful light has been reached, and a short wavelength photo-cathode material positioned within the system to prevent excitation by NIR light.

In addition, provided is a system for electron pattern imaging that includes: a device for converting electron patterns into visible light provided to receive an electron backscatter diffraction (EBSD) pattern from a sample and convert the EBSD pattern to a corresponding light pattern; a camera positioned downstream from the device for converting electron patterns into visible light for obtaining an image of the light pattern; an image intensifier positioned between the device for converting electron patterns into visible light and the camera for amplifying the light pattern produced by the device for converting electron patterns into visible light; and a device positioned within the system for protecting the image intensifier from near infrared (NIR) light.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. As used in the specification and the claims, the singular form of "a", "an", and "the" include plural referents unless the context clearly dictates otherwise.

DESCRIPTION OF THE INVENTION

Figure 1:
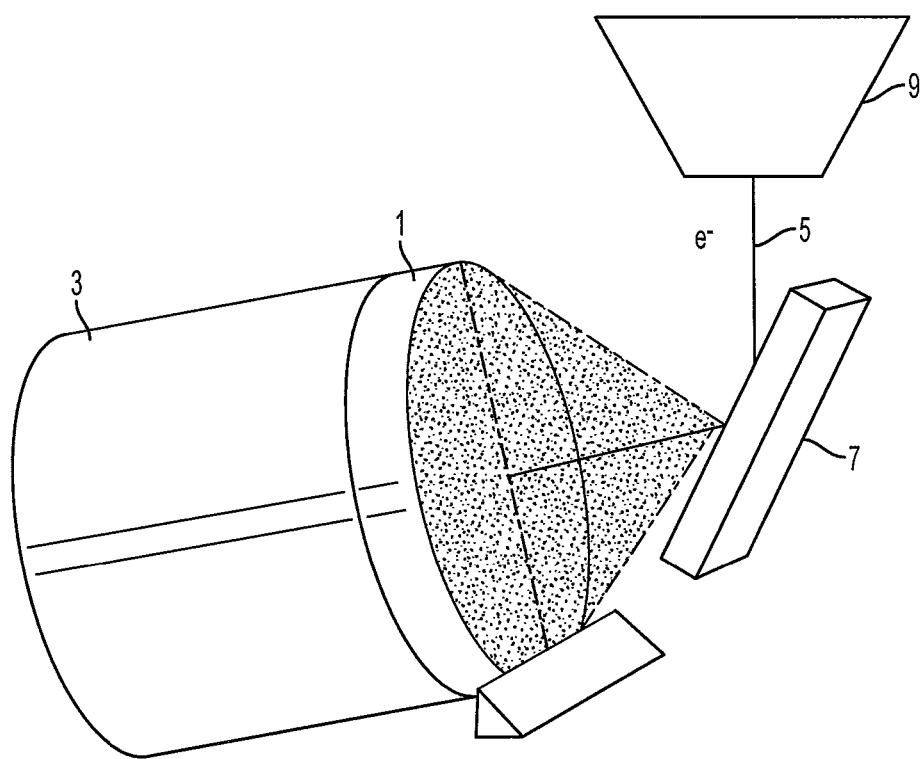
FIG. 1 is a schematic illustration of a conventional system for collecting EBSD patterns.

For purposes of the description hereinafter, the terms "upper", "lower", "right", "left", "vertical", "horizontal", "top", "bottom", "lateral", "longitudinal", and derivatives thereof shall relate to the invention as it is oriented in the drawing figures. However, it is to be understood that the invention may assume various alternative variations, except where expressly specified to the contrary. It is also to be understood that the specific devices illustrated in the attached drawings, and described in the following specification, are simply exemplary embodiments of the invention. Hence, specific dimensions and other physical characteristics related to the embodiments disclosed herein are not to be considered as limiting.

Figure 2:
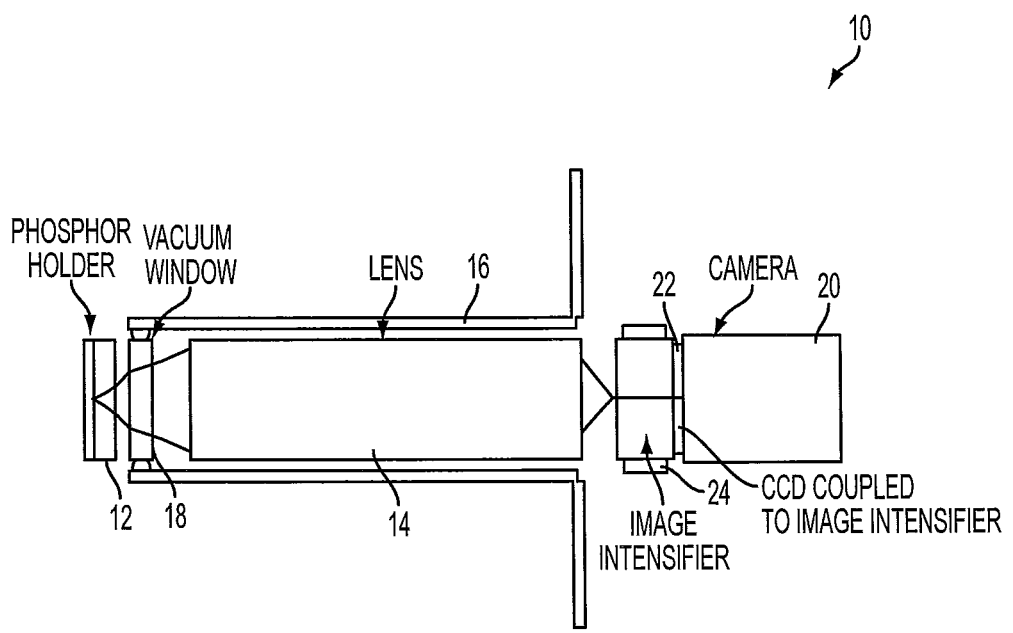
FIG. 2 is a schematic illustration of an EBSD pattern collection apparatus in accordance with one embodiment of the present invention.

With reference to FIG. 2, a system for electron pattern imaging, denoted generally as reference numeral 10, includes: a device for converting electron patterns into visible light, such as a phosphor screen 12, provided to receive an electron backscatter diffraction (EBSD) pattern from a sample (not shown) and convert the EBSD pattern to a corresponding light pattern. The system 10 further includes a first optical system 14 positioned downstream from the phosphor screen 12 for focusing the light pattern produced by the phosphor screen 12. The first optical system 14 may be positioned within a chamber 16 having a vacuum formed therein to receive the light pattern through a vacuum window 18. While the phosphor screen 12 is described hereinabove and hereinafter as an example of a device for converting electron patterns into visible light, this is not to be construed as limiting the present invention as YAG crystals or any other suitable device may be utilized to convert electron patterns into visible light.

The system 10 further includes a camera 20 positioned downstream from the first optical system 14 for obtaining an image of the light pattern. The camera 20 may include any suitable image sensor, such as a CCD 22. An image intensifier 24 is positioned between the phosphor screen 12 and the camera 20 for amplifying the light pattern produced by the phosphor screen 12. Desirably, the image intensifier 24 is positioned between the first optical system 14 and the camera 20 as shown in FIG. 2. However, this is not to be construed as limiting the present invention as the image intensifier 24 may also be positioned (1) between the phosphor screen and the first optical system or (2) within the first optical system. If the image intensifier 24 is positioned between the first optical system 14 and the camera 20, then a second optical system (not shown) may be positioned between the image intensifier 24 and the camera 20. The second optical system may include a focusing lens, a relay lens, a fiber optic relay, or any combination thereof.

Figure 3:
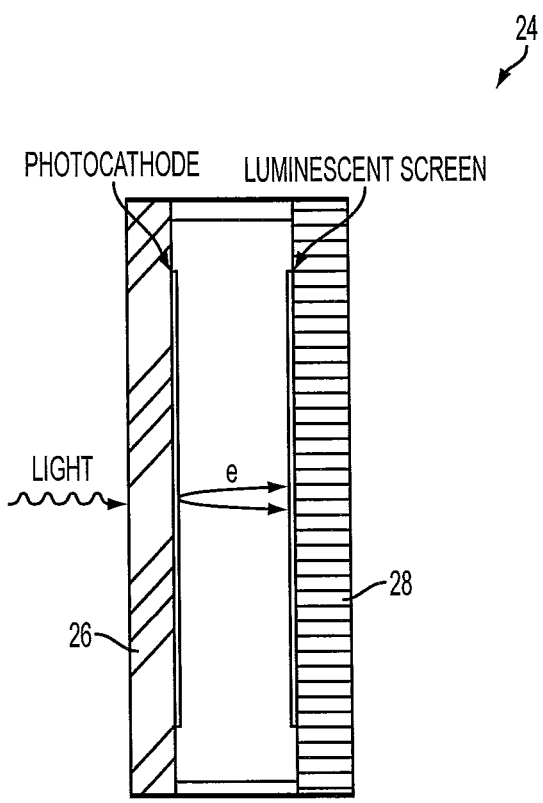
FIG. 3 is a cross-sectional view of an image intensifier for use with the apparatus of FIG. 2.

The image intensifier 24 may be a PROXIFIER® image intensifier manufactured by PROXITRONIC Detector Systems GmbH. With reference to FIG. 3, such an image intensifier 24 includes a photo-cathode 26 and a fluorescent screen 28. In operation, light impinges upon the photo-cathode 26 through an input window of the image intensifier 24. Due to the photoelectric effect, electrons are produced which escape from the photo-cathode 26 with very little energy. By a high potential electrical acceleration field between the photo-cathode 26 and the fluorescent screen 28 of 10 kV to 15 kV, the electrons are strongly accelerated and, at the same time, closely focused. They strike the fluorescent screen 28 with high kinetic energy and stimulate fluorescence. The use of such an image intensifier is for exemplary purposes only and is not to be construed as limiting the present invention as any suitable image intensifier may be utilized.

The system 10 may further include an alignment mechanism (not shown) for aligning the camera 20 and/or the image intensifier 24 with the phosphor screen 12.

Figure 4A:
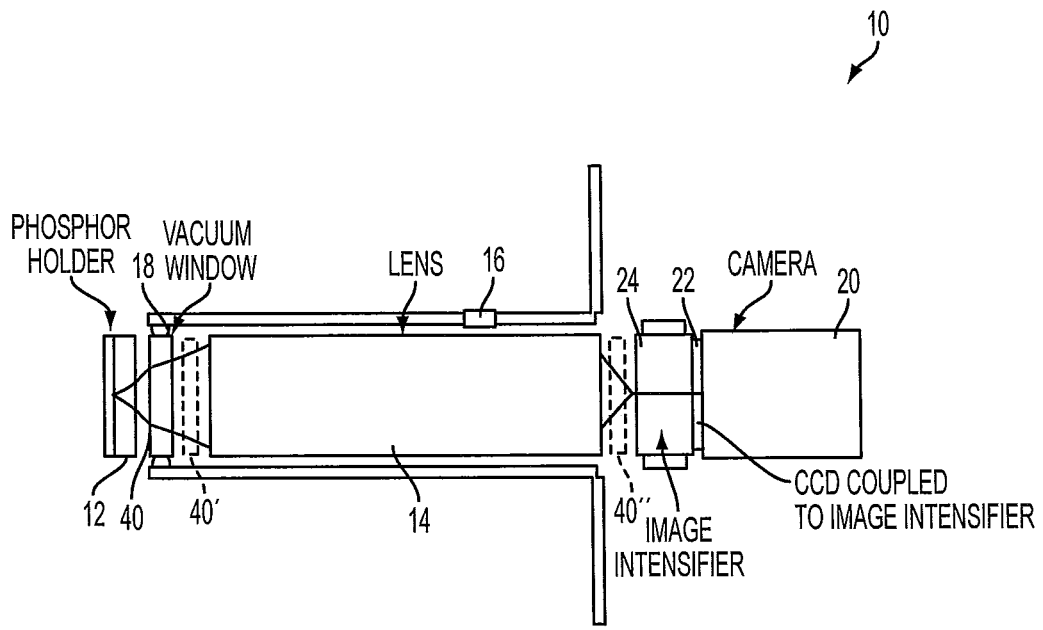
FIG. 4A is a schematic illustration of an EBSD pattern collection apparatus in accordance with a first alternative embodiment of the present invention.

The system 10 of the present invention further contemplates the use of a device or method to protect the image intensifier 24 from harmful light, thereby allowing the system 10 to safely and cost-effectively utilize such an image intensifier 24. With reference to FIG. 4A, the device may be a near infrared (NIR) cut-off filter positioned upstream from the image intensifier 24 for preventing NIR light from reaching the image intensifier 24. The near infrared (NIR) cut-off filter may be provided as a filter coating 40 provided on the vacuum window 18. Alternatively, the near infrared (NIR) cut-off filter may be a filter 40' positioned behind the vacuum window 18 (shown in phantom in FIG. 4A). Still further, the near infrared (NIR) cut-off filter may be a filter 40" positioned in front of the image intensifier 24.

Figure 4B:
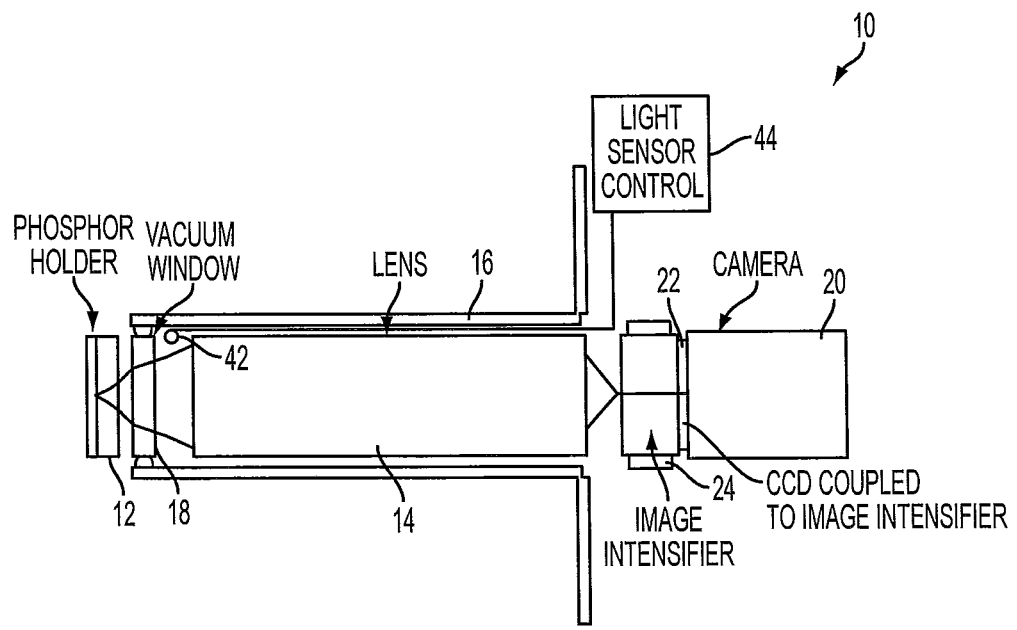
FIG. 4B is a schematic illustration of an EBSD pattern collection apparatus in accordance with a second alternative embodiment of the present invention.

With reference to FIG. 4B, the device for protecting the image intensifier 24 from harmful light may also be embodied as a light sensitive sensor 42 in communication with a controller 44 for detecting when a predetermined level of harmful light has been reached. The controller 44 may be configured to shut down the image intensifier 24 when the predetermined level of harmful light is detected by the light sensitive sensor 42.

Figure 4C:
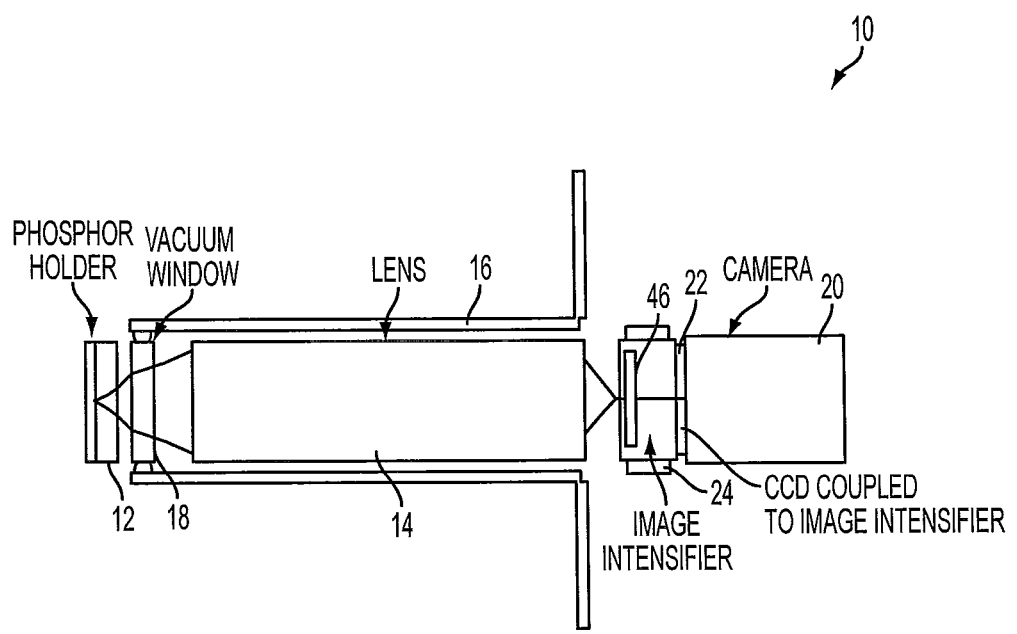
FIG. 4C is a schematic illustration of an EBSD pattern collection apparatus in accordance with a third alternative embodiment of the present invention.

Still further, and with reference to FIG. 4C, the device for protecting the image intensifier 24 from harmful light may be configured as a short wavelength photo-cathode material 46 positioned within the system 10 to prevent excitation by near infrared (NIR) light. Desirably, the photo-cathode material 46 is an internal part of the image intensifier 24 as shown in FIG. 4C. As such, the photo-cathode material 46 may be integral with the photo-cathode 26 of the image intensifier 24 or it may be a separate component.

Additionally, other alternatives for protecting the image intensifier 24 are as follows. The controller may be configured to depower the image intensifier 24 when a level of harmful light is detected by the image intensifier 24 by monitoring an electronic signal from the image intensifier 24. Alternatively, the controller may be configured to enable power to the image intensifier 24 only when a level of chamber vacuum indicates a closed chamber (i.e., no external light). A final alternative is to configure the controller to enable power to the image intensifier 24 only when the software provided thereon detects a safe operating condition such as appropriate microscope conditions software running properly and other system safety checks.

The system 10 described hereinabove enables an intensified CCD array to be used for EBSD. In order for such an intensified CCD array to be utilized in such a manner, the controller must be configured to allow for automatic intensified gain control based upon feedback from the CCD 22. In addition, the controller must also be configured to provide gain/contrast control based on analysis intensity and contrast in the EBSD images. Accordingly, the system 10 is capable of obtaining high quality EBSD patterns with high spatial resolution of the sample by using the intensified CCD array even at low electron accelerating beam voltages.

The use of the image intensifier 24 between the phosphor screen 12 and the camera 20 also improves low level signal EBSD pattern detection. This overcomes the limitations of CCD light sensitivity and enables detection of weak EBSD patterns, such as those provided in poorly formed crystals, inhomogeneity, poor surface preparation, etc. By positioning the image intensifier 24 in the system as described hereinabove, the speed of EBSD pattern recognition is improved, thereby shortening the time required to achieve an EBSD pattern suitable for indexing. Finally, by simultaneously controlling incident beam voltage and the gain of the image intensifier 24 to achieve optimal image contrast in the CCD 22, the EBSD sensitivity is improved.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements. Furthermore, it is to be understood that the present invention contemplates that, to the extent possible, one or more features of any embodiment can be combined with one or more features of any other embodiment.

The invention claimed is:

1. A system for electron pattern imaging comprising:
a device for converting electron patterns into visible light provided to receive an electron backscatter diffraction (EBSD) pattern from a sample and convert the EBSD pattern to a corresponding light pattern;
a first optical system positioned downstream from the device for converting electron patterns into visible light for focusing the light pattern produced by the device for converting electron patterns into visible light;
a camera positioned downstream from the first optical system for obtaining an image of the light pattern;
an image intensifier positioned between the device for converting electron patterns into visible light and the camera for amplifying the light pattern produced by the device for converting electron patterns into visible light; and
a device positioned within the system for protecting the image intensifier from harmful light, the device selected from the group consisting of: a near infrared (NIR) cut-off filter positioned upstream from the image intensifier for preventing NIR light from reaching the image intensifier, a light sensitive sensor in communication with a controller for detecting when a predetermined level of harmful light has been reached, and a short wavelength photo-cathode material positioned within the system to prevent excitation by NIR light.

2. The system of claim 1, wherein the image intensifier is positioned between the device for converting electron patterns into visible light and the first optical system.

3. The system of claim 1, wherein the image intensifier is positioned within the first optical system.

4. The system of claim 1, wherein the image intensifier is between the first optical system and the camera.

5. The system of claim 4, further comprising a second optical system positioned between the image intensifier and the camera.

6. The system of claim 5, wherein the second optical system comprises a focusing lens, a relay lens, a fiber optic relay, or any combination thereof.

7. The system of claim 1, further comprising an alignment mechanism for aligning at least one of the camera and the image intensifier with the device for converting electron patterns into visible light.

8. A method of electron pattern imaging comprising:
positioning a device for converting electron patterns into visible light adjacent to a sample;
positioning a first optical system downstream from the device for converting electron patterns into visible light;
positioning a camera downstream from the first optical system;

positioning an image intensifier between the device for converting electron patterns into visible light and the camera;

positioning a device within the system for protecting the image intensifier from harmful light;

receiving an electron backscatter diffraction (EBSD) pattern from a sample with the device for converting electron patterns into visible light such that the device for converting electron patterns into visible light converts the EBSD pattern to a corresponding light pattern;

focusing the light pattern produced by the device for converting electron patterns into visible light with the first optical system;

amplifying the light pattern produced by the device for converting electron patterns into visible light with the image intensifier; and obtaining an image of the light pattern with the camera, wherein the device for protecting the image intensifier from harmful light is selected from the group consisting of: a near infrared (NIR) cut-off filter positioned upstream from the image intensifier for preventing NIR light from reaching the image intensifier, a light sensitive sensor in communication with a controller for detecting when a predetermined level of harmful light has been reached, and a short wavelength photo-cathode material positioned within the system to prevent excitation by NIR light.

9. The method of claim 8, wherein the image intensifier is positioned between the device for converting electron patterns into visible light and the first optical system.

10. The method of claim 8, wherein the image intensifier is positioned within the first optical system.

11. The method of claim 8, wherein the image intensifier is between the first optical system and the camera.

12. The method of claim 11, further comprising a second optical system positioned between the image intensifier and the camera.

13. The method of claim 12, wherein the second optical system comprises a focusing lens, a relay lens, a fiber optic relay, or any combination thereof.

14. The method of claim 8, further comprising an alignment mechanism for aligning at least one of the camera and the image intensifier with the device for converting electron patterns into visible light.

15. A system for electron pattern imaging comprising:
a device for converting electron patterns into visible light provided to receive an electron backscatter diffraction (EBSD) pattern from a sample and convert the EBSD pattern to a corresponding light pattern;
a camera positioned downstream from the device for converting electron patterns into visible light for obtaining an image of the light pattern;
an image intensifier positioned between the device for converting electron patterns into visible light and the camera for amplifying the light pattern produced by the device for converting electron patterns into visible light; and
a device positioned within the system for protecting the image intensifier from near infrared (NIR) light.

16. The system of claim 15, wherein the device for protecting the image intensifier from NIR light comprises an NIR cut-off filter positioned upstream from the image intensifier for preventing NIR light from reaching the image intensifier.

17. The system of claim 15, wherein the device for protecting the image intensifier from NIR light comprises a light sensitive sensor in communication with a controller for detecting when a predetermined level of harmful light has been reached,
wherein the controller shuts down the image intensifier when the predetermined level of harmful light is detected by the light sensitive sensor.

18. The system of claim 15, wherein the device for protecting the image intensifier from NIR light comprises a short wavelength photo-cathode material positioned within the system to prevent excitation by near infrared (NIR) light.

19. The system of claim 15, further comprising a first optical system positioned downstream from the device for converting electron patterns into visible light for focusing the light pattern produced by the device for converting electron patterns into visible light.

20. The system of claim 19, wherein the image intensifier is positioned at one of between the device for converting electron patterns into visible light and the first optical system, within the first optical system, or between the first optical system and the camera.

* * * * *